(12) United States Patent
Kassir

(10) Patent No.: US 6,743,722 B2
(45) Date of Patent: Jun. 1, 2004

(54) METHOD OF SPIN ETCHING WAFERS WITH AN ALKALI SOLUTION

(75) Inventor: Salman M. Kassir, San Luis Obispo, CA (US)

(73) Assignee: Strasbaugh, San Luis Obispo, CA (US)

( * ) Notice: Subject to any disclaimer, the term of this patent is extended or adjusted under 35 U.S.C. 154(b) by 0 days.

(21) Appl. No.: 10/059,701

(22) Filed: Jan. 29, 2002

(65) Prior Publication Data

US 2003/0143861 A1 Jul. 31, 2003

(51) Int. Cl.$^7$ .............................................. H01L 21/304
(52) U.S. Cl. ....................... 438/690; 438/460; 438/748; 438/977
(58) Field of Search ................................. 438/460, 690, 438/748, 977

(56) References Cited

U.S. PATENT DOCUMENTS

| | | | |
|---|---|---|---|
| 3,841,031 A | 10/1974 | Walsh | 51/283 |
| 4,252,865 A | 2/1981 | Gilbert et al. | 428/611 |
| 4,343,662 A | 8/1982 | Gay | 148/187 |
| 4,557,785 A | 12/1985 | Ohkuma | 156/345 |
| 4,612,408 A * | 9/1986 | Moddel et al. | |
| 5,113,622 A | 5/1992 | Nishiguchi et al. | 51/165.73 |
| 5,268,065 A | 12/1993 | Grupen-Shemansky | 156/630 |
| 5,277,769 A | 1/1994 | Medernach | 204/129.3 |
| 5,476,819 A | 12/1995 | Warren | 437/228 |
| 5,693,182 A | 12/1997 | Mathuni | 156/645.1 |
| 5,695,557 A | 12/1997 | Yamagata et al. | 117/97 |
| 5,733,814 A | 3/1998 | Flesher et al. | 438/460 |
| 5,840,199 A | 11/1998 | Warren | 216/2 |
| 5,942,445 A | 8/1999 | Kato et al. | 438/691 |
| 6,026,830 A | 2/2000 | Huang | 134/66 |
| 6,099,662 A | 8/2000 | Wang et al. | 134/26 |
| 6,102,057 A | 8/2000 | Vogtmann et al. | 134/144 |
| 6,136,171 A * | 10/2000 | Frazier et al. | |
| 6,149,759 A | 11/2000 | Guggenberger | 156/345 |
| 6,162,739 A | 12/2000 | Sumnitsch et al. | 438/745 |
| 6,169,038 B1 | 1/2001 | Kruwinus et al. | 438/745 |
| 6,187,605 B1 | 2/2001 | Takasu et al. | 438/29 |
| 6,224,668 B1 | 5/2001 | Tamatsuka | 117/84 |
| 6,248,661 B1 | 6/2001 | Chien et al. | 438/632 |
| 6,268,237 B1 | 7/2001 | Flesher et al. | 438/106 |
| 6,335,269 B1 | 1/2002 | Sato | 438/509 |
| 6,337,027 B1 | 1/2002 | Humphrey | 216/2 |
| 2001/0039119 A1 | 11/2001 | Kishimoto | |
| 2002/0014661 A1 | 2/2002 | Okamoto et al. | |

* cited by examiner

Primary Examiner—Felisa Hiteshew
(74) Attorney, Agent, or Firm—Theodore D. Fay III, Esq.; Crockett & Crockett

(57) ABSTRACT

A method of relieving surface stress on a thin wafer by removing a small portion of the wafer substrate, the substrate being removed by applying a solution of KOH to the wafer while the wafer spins.

17 Claims, 4 Drawing Sheets

METHOD OF SPIN ETCHING WAFERS WITH AN ALKALI SOLUTION

FIELD OF THE INVENTIONS

The methods and devices described below relate to the field of integrated circuit manufacture.

BACKGROUND OF THE INVENTIONS

To build an integrated circuit chip, a layer of selected materials is deposited on a silicon substrate using a variety of deposition techniques, including chemical vapor deposition, sputtering, ashing, and other techniques. Chemical mechanical planarization (CMP) usually is performed after depositing the layer. CMP provides smooth, planar topographies to semiconductor wafers and surfaces deposited on a semiconductor substrate, such as silicon, and is an integral part of making many types of integrated chips. The deposition and polishing steps are repeated as necessary to build a multi-layer integrated chip. For example, a layer of electrically conducting material is sputtered onto an etched substrate. The CMP process then is used to remove the layer until the electrically conducting material remains only in the etched areas. Subsequently, additional layers are added and then polished until the final product is achieved: many layers of integrated circuits on the built-up front side of the silicon substrate.

When building integrated chips it is important that the semiconductor substrate be very thin, as thin as 100 micrometers or even 75 micrometers ($\mu$m). To make the substrate as thin as possible, and to relieve stress caused during the deposition and CMP processes, the back of the wafer is ground to remove the bulk of the substrate. This process is known as backgrinding. However, stresses build up during the backgrinding process that tend to warp the wafer and make it vulnerable to breaking when the wafer is later cut into individual die. The stress is caused by small deformations on the surface of the substrate, typically grind lines, that arise from the physical force of grinding. In addition, the stress caused by backgrinding is exacerbated by internal stresses accumulated during the layer building process. Thus, it is important to relieve as much wafer stress as possible.

Currently, wafers are wet-etched with acid etchants to relieve stress after backgrinding. However, wet etching with acid poses four significant problems. First, the acid may damage the outer edge of the top layers of the wafer if the acid seeps through the protective means, such as backgrind tape, used protect the front side of the wafer. The damage can destroy integrated chips located around the edge of the wafer, thus reducing production efficiency. Second, using acids is inefficient. Wet etching with acids requires that the background wafers be transferred to a separate machine built to withstand the acids. The time required to transfer the wafers and conduct an additional process reduces the efficiency of chip production. In addition, a machine that can perform wet etching with acid is very expensive, both initially and operationally, thus making the process more expensive and less efficient. Third, transferring fragile wafers to a separate machine while the wafers are at a maximum state of stress increases the probability of damaging the wafers, thereby further reducing efficiency and increasing the cost of production. Fourth, the acids typically used in the etching process are environmentally toxic and difficult to dispose of properly. The cost of the acids, plus the cost of disposing of the acids, make the cost of using an acid wet etch process even more expensive. Thus, a new method for reducing wafer stress has been developed in order to avoid unnecessary damage to the integrated chips on the front side of the wafer, increase efficiency, reduce cost, and reduce environmental pollution.

SUMMARY

The methods and systems described below provide for a more efficient, a less expensive, and easier stress relief process after backgrinding. Instead of using acids to perform stress relief, the wafers are placed onto a spinning platform in a chamber used for the normal rinse step of the backgrinding process. A solution of potassium hydroxide (KOH) is then sprayed onto the substrate side of the wafer while it is spinning. The KOH solution performs the substrate removal necessary to reduce surface stresses in the wafer, while spinning the wafer ensures that the substrate removal is evenly distributed. After spin etching is completed the wafer is rinsed and then moved to the next processing step.

DETAILED DESCRIPTION OF THE INVENTIONS

Figure 1:
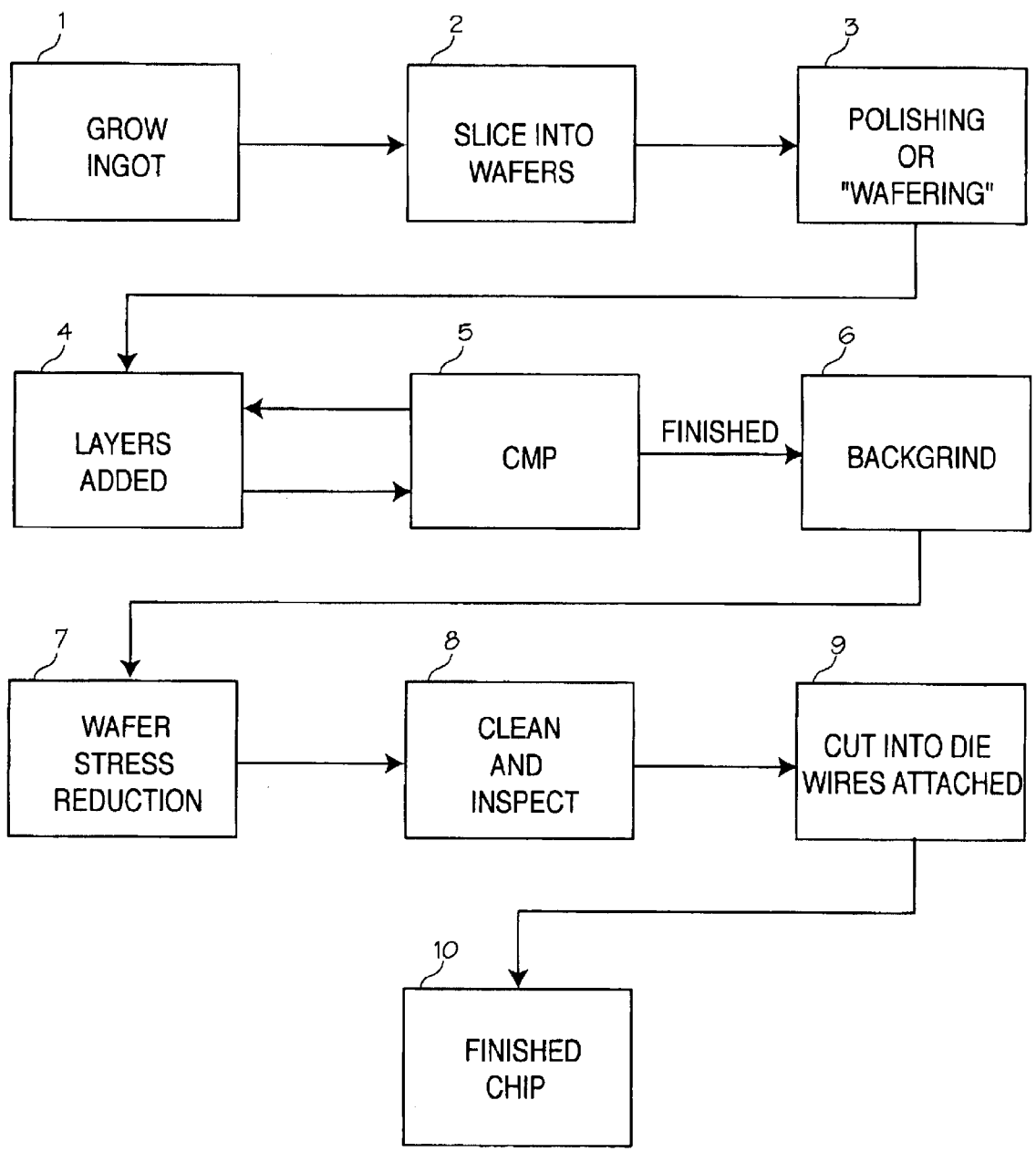
FIG. 1 is a block diagram of a system for producing integrated chips, including the backgrinding step and the step of spin etching the backside of a wafer with an alkali etch solution.

FIG. 1 is a block diagram of a system for producing integrated chips, including the backgrinding step and the step of spin etching the backside of a wafer with an alkali etch solution. In step 1 silicon is purified and cast into electronic-grade ingots. The ingots are then converted into high purity, single crystal silicon by growing a crystal silicon structure. In step 2 the ingot is sliced into wafers using a diamond saw, with each wafer being approximately ¹⁄₄₀" thick. In step 3 each wafer is polished, lapped smooth, damage decorated with acid to reveal hidden defects, and may be ground either over the wafer surface or at its edges. After the polishing processing, also known as wafering, is complete the new prime wafer is ready to have integrated circuits built upon it. In steps 4 and 5, integrated circuits are built onto the front side of the wafer. In step 4 at least one layer of material is deposited onto the silicon wafer substrate. Then, in step 5, a CMP process is applied to the layer in order to ensure a very flat surface, to enhance photolithographic abilities, to improve metal wiring quality, to enhance step coverage, and to realize other advantages. The result is many integrated circuits deposited on a silicon substrate. Steps 4 and 5 are repeated as necessary until the desired number and types of layers are reached and a complicated plurality of integrated circuits is built up on the front side of the wafer. In step 6 the bulk of the silicon substrate is removed from the back side of the wafer in a process known as backgrinding. Backgrinding makes the overall chip thinner, thus allowing better heat dissipation in the finished integrated circuit chip. However, backgrinding adds surface stress to the wafer, thus making the wafer more prone to warping.

In step 7 the wafer is processed to relieve surface stress on the backside of the wafer. In this step, the wafer is spin etched in an alkali etchant. We apply an aqueous solution of potassium hydroxide (KOH), or other base or alkali etch solution, to a spinning wafer in a gaseous environment. The KOH spin etching method removes a sufficient portion of the substrate layer to relieve the stress in the wafer.

In step 8 the newly etched wafer is rinsed and dried. It is also inspected for unwanted defects. In step 9 the wafer is cut into individual die. Each die is an individual integrated circuit chip. Each die is then processed by attaching wires to pre-determined locations on the integrated circuit chip. In step 10 the new integrated circuit chips are tested and then encapsulated into ceramic or plastic enclosures.

Figure 2:
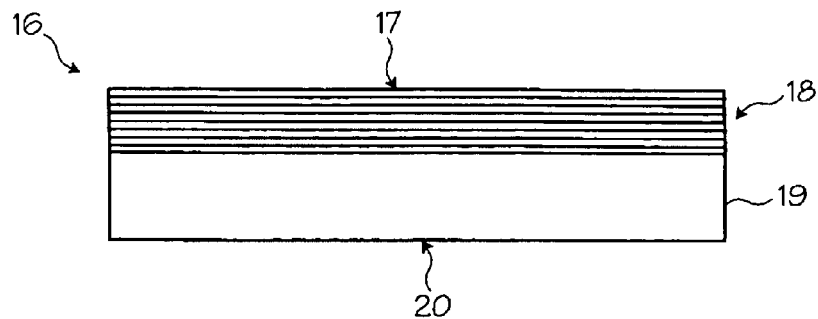
FIG. 2 illustrates a cross section of a silicon wafer upon which a plurality of layers has been deposited.

FIGS. 2 through 4b illustrate the principles of the stress reduction step represented by block 7 in FIG. 1. FIG. 2 illustrates a cross section of a wafer 16 and the front side 17 of a plurality of layers 18 which have been deposited on a silicon substrate 19. The CMP process has made the surface 17 of the wafer 16 planarized and smooth. Backgrinding has removed much of the original thickness from the back side 20 of the silicon substrate 19. However, the physical force used during backgrinding causes surface stress to build up along the bottom surface 20 of the wafer 16.

Figure 3:
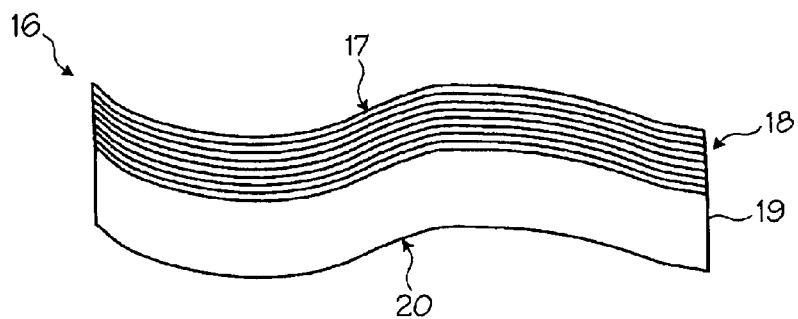
FIG. 3 illustrates the warping that can occur in the wafer of FIG. 2 if the stresses in the wafer are not relieved.

FIG. 3 illustrates the warping that can occur due to these stresses when the silicon substrate 19 and overall wafer 16 become very thin. The bottom surface 20, top surface, 17, and layers 18 become non-planar, rendering the wafer useless for most applications. Spin etching with an aqueous solution of KOH after backgrinding will relieve surface stresses along the bottom surface 20 of the wafer 16 and thereby avoid this warping.

Figure 4A:
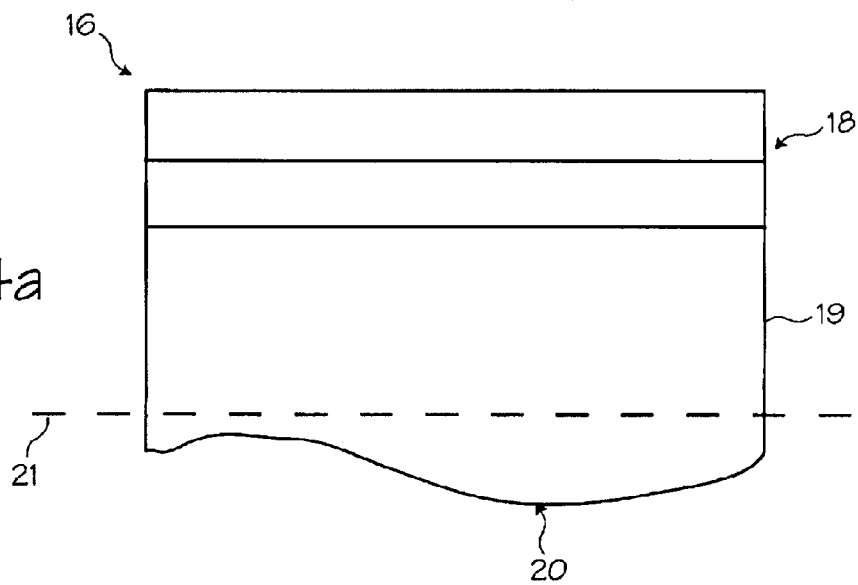
FIG. 4a shows the wafer of FIG. 2 further magnified to illustrate bottom surface warping caused by backgrinding.

FIG. 4a shows a magnified cross-section of the wafer 16 shown in FIG. 2 and illustrates the non-planar bottom surface 20 of the substrate 19 remaining after backgrinding. The warping is reduced by chemically removing a portion of the bottom surface 20. The demarcation line 21 shown in phantom illustrates the portion of substrate that is removed (the portion removed is below the phantom line 21). By removing the irregular surface of the substrate 19 the overall stress in the wafer 16 is reduced. Note that the degree of warping shown is exaggerated in comparison to the total thickness of the wafer. The backgrinding process typically grinds a 700 micrometer ($\mu$m) substrate to a thickness of from about 250 $\mu$m to about 75 $\mu$m. On the other hand, the amount of silicon removed from the back side 20 of the substrate 19 by etching is typically from about 0.1 $\mu$m to about 2 $\mu$m.

Figure 4B:
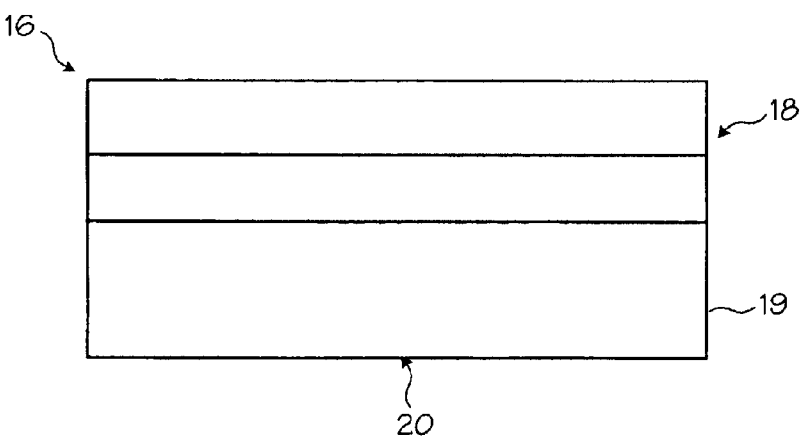
FIG. 4b illustrates the wafer after a portion of the bottom surface of the substrate has been removed.

FIG. 4b illustrates the wafer 16, including the deposited layers 18, after a portion of the bottom surface 20 of the substrate 19 has been chemically removed. The surface stress on the wafer is now greatly reduced. Because one of the major sources of stress has been significantly reduced, the wafer is much more stable and is much more likely to retain its shape.

Figure 5:
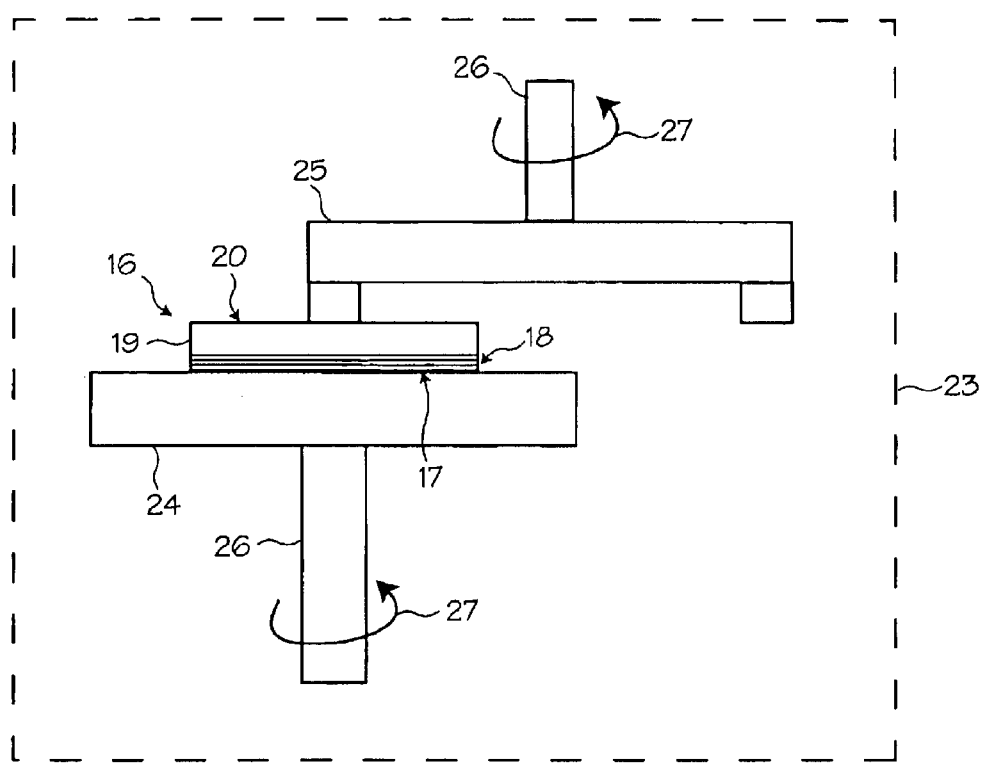
FIG. 5 illustrates the process of backgrinding an integrated chip substrate.
Figure 6:
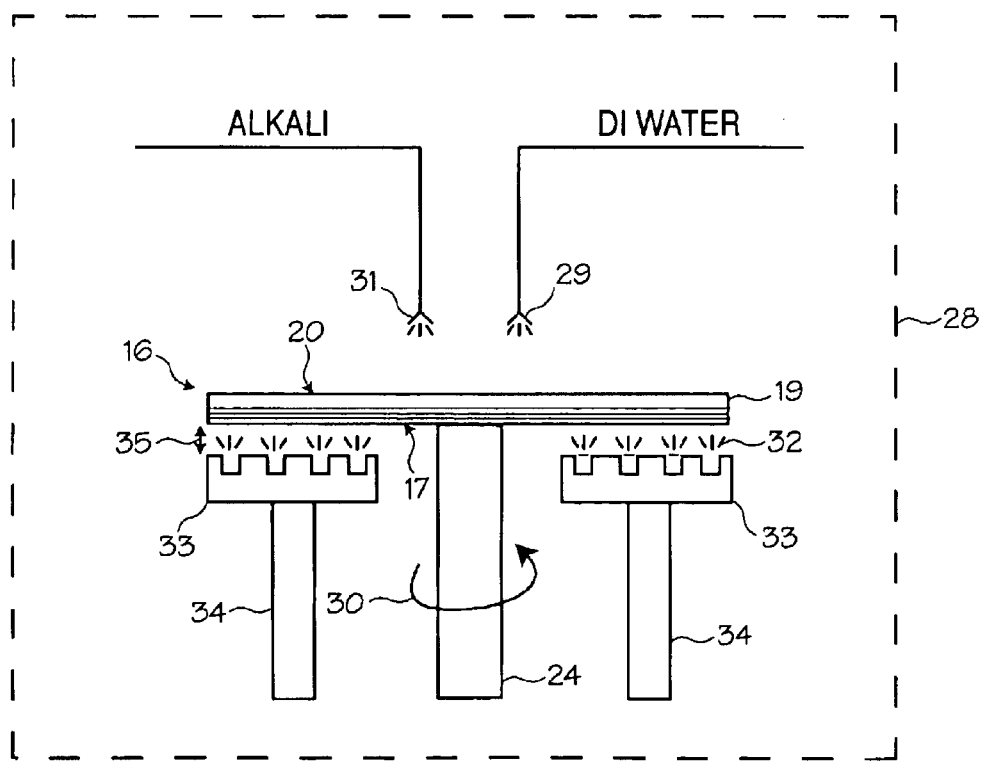
FIG. 6 illustrates the methods and systems used to perform spin etching with an alkali solution to achieve wafer stress relief.
Figure 7:
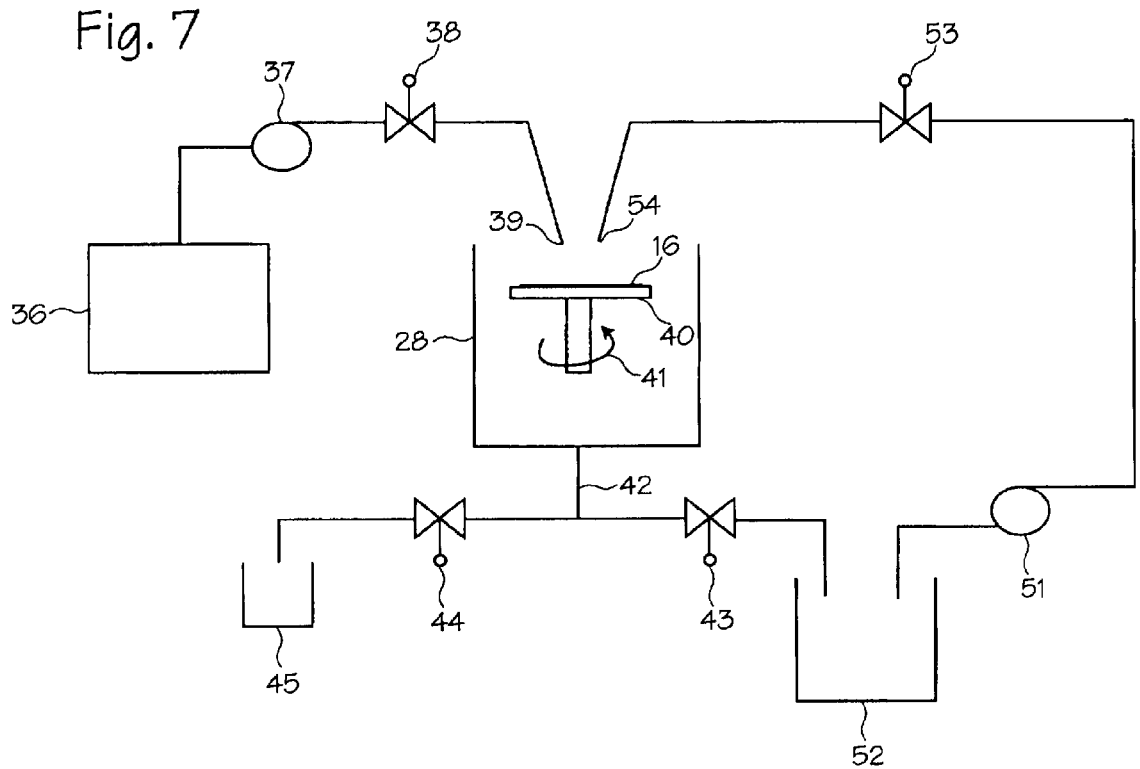
FIG. 7 is a schematic of the rinse station of a modified version of a Strasbaugh 7AF Intelligent Wafer Grinder.

FIGS. 5 through 7 illustrate methods and devices by which a wafer is background and subsequently spin etched with KOH. FIG. 5 illustrates the process of backgrinding an integrated chip substrate 19 in a grinding chamber 23. First, the wafer's front side 17, comprising the multiple layers of deposited material 18, is secured to a work chuck 24 by means of a vacuum. Backgrind tape may be placed on the front side of the wafer to protect it during handling, during the grinding step, and during the etching step. Subsequently, the grinding wheel 25 grinds the back side 20 of the wafer and removes the bulk of the silicon substrate 19 as the work chuck and grind wheel rotate on spindles 26, as shown by arrows 27. After backgrinding, a robotic arm typically transfers the wafer 16 to another work chuck in a separate rinse station.

FIG. 6 illustrates the methods and systems used to perform spin etching with KOH to achieve stress relief. The spin etch process is performed in the same rinse chamber 28 used to rinse the wafer 16 after backgrinding. However, the rinse chamber is coated with Teflon©, or a similar non-reactive or corrosive-resistant material, to protect the chamber from the corrosive effects of KOH.

The center of the front side 17 of the wafer 16 is secured to the relatively narrow work chuck 24 by means of a vacuum. The back side 20 of the wafer is then rinsed with de-ionized water (DI water) 29 while the wafer 16 rotates about the axis of the work chuck 24, as shown by arrow 30. After rinsing, the back side 20 of the wafer is sprayed with a warm alkali etching solution 31, typically KOH, while the wafer 16 continues to rotate. The warm alkali solution removes a portion of the substrate 19, thus relieving stress in the wafer 16. While the alkali solution is applied to the back side 20 of the wafer, the front side 17 of the wafer 16 is simultaneously sprayed with chilled deionized water 32 at a temperature of about 5° Celsius to about 15° Celsius. The chilled deionized water is sprayed from a plurality of nozzles, or injection ports, disposed within an annular nozzle platform 33. The nozzle platform 33 is supported by a support 34. The distance between the nozzle platform 33 and the wafer 16, shown by arrows 35, can vary, but is typically about 1 millimeter. The chilled water keeps the wafer 16 cool, thus protecting it from the relatively high temperature of the alkali solution. Furthermore, the chilled water protects the front side 17 of the wafer 16 from direct contact with the alkali solution.

The bulk of the alkali solution and cooling water is thrown outward by the centrifugal force caused by spinning the wafer and the mixture of waste alkali solution and waste water is drained away into a waste or recycle tank. The rinse station's exhaust system then collects much of the remaining residue of alkali solution thrown from the wafer. After the etching process is complete, both the backside 19 and front side 17 of the wafer 16 are given a secondary rinse of de-ionized water to remove any remaining alkali solution. The wafer 16 is then dried by blowing air from the bottom of the chamber while spinning the wafer at a rate of about 2000 RPM to about 4000 RPM. Finally, the wafer is transferred from the rinse and etch chamber to the next stage of wafer or chip processing.

To remove the required amount of substrate a solution of from about 20% to about 40% of KOH at a temperature of about 55° Celsius to about 85° Celsius is sprayed onto the back side 20 of the silicon wafer 16 at a rate of about 100 milliliters per minute (ml/minute) to about 500 ml/minute for about 1 minute to about 5 minutes. In order to ensure that the substrate is chemically removed to an even depth, the silicon wafer is spun at a rate of about 20 RPM to about 500 RPM: typically in the range of about 20 RPM to about 50 RPM. The centrifugal force of spinning causes the KOH solution to spread evenly across the back side 20 of the wafer 16, prevents the KOH from building up in relatively low areas on the substrate, and ensures that relatively high areas on the substrate are worn down preferentially. At the same time that the KOH is applied to the backside 20 of the wafer 16, the front side 17 of the wafer 16 is sprayed with deionized water 32 chilled to a temperature from about 5° Celsius to about 15° Celsius.

As an alternative to using the vacuum chuck described above, the wafer 16 may be secured to a rotatable chuck which supports the entire front side of the wafer, such as the chuck shown in FIG. 5. In this case, the wafer is secured to the chuck with backgrind tape, which may be the same backgrind tape used to secure the wafer during the backgrind process. Thus, it is possible to design a machine that performs the backgrind, rinse, and alkali spin etch steps all in the same chamber of the same machine. Whichever chuck to which the wafer is secured, only the back side 20 of the wafer 16 is exposed to the KOH during the spin etch process. The front side of the wafer is then cooled by directly cooling the chuck in a water bath or by thermal coupling to some other heat sink. In the case of a water bath, the wafer is secured to the chuck by a vacuum while water is circulated underneath the wafer. The circulating water directly contacts the front side of the wafer, though the level of the water is carefully controlled to prevent it from touching the backside of the wafer while spin etching is performed.

Whichever version of the chuck is selected, either that exemplified in FIG. 5 or that exemplified in FIG. 6, the chuck is designed such the wafer 16 need not leave the rinse station chuck 24 between the rinse, spin etch, and secondary rinse steps. Thus, the overall efficiency of the process is increased.

FIG. 7 is a schematic of the rinse station of a modified version of the Strasbaugh 7AF Intelligent Wafer Grinder, a machine used to perform backgrinding and other wafer grinding applications. Although a modified version of the Strasbaugh 7AF Intelligent Wafer Grinder is used to illustrate the methods described below, the methods are not dependent on that machine. The methods could be used in nearly any machine used to rinse wafers. Alternatively, the method could be used in a machine separate from the one used to perform the rinse step, as is typically done for acid etching methods.

After backgrinding, the wafer 16 is rinsed with de-ionized water pumped from a de-ionized water tank 36 by a pump 37 through a DI water valve 38 and ultimately through a nozzle 39. The de-ionized water removes small particulates left behind during the grinding process. In order to ensure that all of the particulate matter is rinsed away, the wafer 16 is spun on a platform 40 as shown by arrow 41. The waste water then falls through the rinse station drain 42. The KOH drain valve 43 is closed and the water drain valve 44 is opened so that the waste water drains away into the waste water tank 45.

After the rinse step the KOH drain valve 43 is opened and the water drain valve 44 is closed. Then, KOH is pumped by a pump 51 from a KOH tank 52 through a KOH valve 53 and finally through a KOH nozzle 54 onto the spinning wafer 16. The excess KOH flows through the rinse station drain 42 and back into the KOH tank 52 where the KOH is recycled. Waste material etched from the wafer 16 will settle to the bottom of the tank and thus will not interfere with the etching process. Periodically, typically every few days, the KOH tank 52 will be drained and fresh KOH will be placed in the tank 52. Alternatively, the KOH is not recycled. In this case, the KOH is delivered from a separate KOH tank. The waste KOH is then drained through the rinse drain 42, through the KOH drain valve 43 and into a waste tank, where the waste KOH is stored before it is eliminated.

Although using a KOH solution on a spinning wafer is useful to remove a portion of the substrate on thin wafers, the method is also useful in other applications. For example, the method is useful for damage decoration, for etching wafer layers, for removing material on prime wafers, and for revealing hidden defects on prime wafers. The process also is useful on wafers using substrates other than silicon, such as gallium arsenide. In addition, other basic and alkali solutions can be used to perform the spin etch process, such as sodium hydroxide, aqueous ammonia, ammonium hydroxide, alkali metal hydroxides, or organic alkali solutions such as trimethyl ammonium.

Thus, while the preferred embodiments of the devices and methods have been described in reference to the environment in which they were developed, they are merely illustrative of the principles of the inventions. Other embodiments and configurations may be devised without departing from the spirit of the inventions and the scope of the appended claims.

I claim:

1. A method of preparing an integrated circuit comprising the steps of:
   providing a silicon wafer having a front side and a back side;
   building the integrated circuit on the front side of the silicon wafer;
   thereafter removing substrate from the back side of the silicon wafer;
   thereafter spraying the back side of the silicon wafer with a base while spinning the wafer; and
   rinsing the silicon wafer.

2. The method of claim 1 further comprising the step of cutting the wafer into die.

3. The method of claim 2 further comprising the step of electrically connecting the die such that each operates as an individual integrated circuit chip.

4. The method of claim 3 further comprising the step of encapsulating the die and preparing each for use as an integrated circuit chip.

5. A method of preparing an integrated circuit comprising the steps of:
   providing a silicon wafer having a front side and a back side;
   building the integrated circuit on the front side of the silicon wafer;
   removing substrate from the back side of the silicon wafer;
   spraying the back side of the silicon wafer with an aqueous solution of potassium hydroxide while spinning the wafer; and
   rinsing the silicon wafer.

6. The method of claim 5 further comprising the step of cutting the wafer into die.

7. The method of claim 6 further comprising the step of electrically connecting the die such that each operates as an individual integrated circuit chip.

8. The method of claim 7 further comprising the step of encapsulating the die and preparing each for use as an integrated chip.

9. The method of claim 8 wherein the aqueous solution of potassium hydroxide comprises a solution of about 20% potassium hydroxide.

10. The method of claim 6 wherein the aqueous solution of potassium hydroxide comprises a solution of about 20% potassium hydroxide.

11. The method of claim 7 wherein the aqueous solution of potassium hydroxide comprises a solution of about 20% potassium hydroxide.

12. The method of claim 5 wherein the aqueous solution of potassium hydroxide comprises a solution of about 20% potassium hydroxide.

13. A method of manufacturing an integrated circuit chip, wherein the integrated circuit chip is manufactured by building up a plurality of integrated circuits on the front side of a silicon wafer substrate and backgrinding the back side of the silicon wafer substrate, and said backgrinding is accomplished by securing the built up front side of the silicon wafer to a work chuck and grinding a portion of the silicon wafer substrate from the back side of the silicon wafer substrate, and thereafter etching the backside of the silicon wafer substrate with an alkali etching solution and cutting the silicon wafer into a plurality of individual integrated circuit chips.

14. The method of claim 13 further comprising the step of spinning the silicon wafer substrate while etching the backside.

15. The method of claim 13 wherein the silicon wafer is maintained on the work chuck during grinding and etching steps.

16. The method of claim 13 wherein the alkali etching solution comprises an aqueous solution of potassium hydroxide.

17. The method of claim 13 wherein the alkali etching solution comprises an aqueous solution of sodium hydroxide.

* * * * *